United States Patent [19]

Lewyn

[11] Patent Number: 4,983,973
[45] Date of Patent: Jan. 8, 1991

[54] NON-LINEAR ANALOG-TO-DIGITAL CONVERTER

[75] Inventor: Lanny L. Lewyn, Laguna Beach, Calif.

[73] Assignee: Brooktree Corporation, San Diego, Calif.

[21] Appl. No.: 354,864

[22] Filed: May 22, 1989

[51] Int. Cl.⁵ .................. H03M 1/36; H03M 1/78; H01C 10/04
[52] U.S. Cl. .................... 341/138; 341/159; 341/154; 338/89; 338/90; 338/325; 338/330
[58] Field of Search ............... 341/138, 140, 118, 159, 341/155, 154; 338/89, 90, 308, 325, 330

[56] References Cited

U.S. PATENT DOCUMENTS

| | | | |
|---|---|---|---|
| 3,653,033 | 3/1972 | Bonami et al. | 341/138 |
| 3,997,892 | 12/1976 | Susset | 341/138 X |
| 4,146,882 | 3/1979 | Hoff, Jr. et al. | 341/138 |
| 4,232,302 | 11/1980 | Jagatich | 341/158 X |
| 4,447,747 | 5/1984 | LaPotin | 341/147 X |
| 4,617,549 | 10/1986 | Reiner | 341/159 X |
| 4,860,011 | 8/1989 | Colles | 341/159 X |

Primary Examiner—William M. Shoop, Jr.
Assistant Examiner—Sharon D. Logan
Attorney, Agent, or Firm—Ellsworth R. Roston; Charles H. Schwartz

[57] ABSTRACT

A first film disposed in a first direction on an integrated circuit chip and having uniformly spaced taps provides progressively increasing resistance values. A second film disposed on the chip in a direction opposite to the first direction at a position displaced in any direction from the first film may have a construction corresponding to that of the first film. First and second reference voltages may be respectively applied to the first and second ends of the first and second films. Particular taps on the first film may be connected to taps in corresponding positions on the second film with corresponding voltages. A plurality of differential comparators are provided, each with a signal input and a reference input. Each comparator reference input is connected to an individual one of the taps on the first film, but not necessarily to successive taps. The reference input connections to the taps may have a non-linear (e.g. a luminance) spacing in the first direction to provide a non-linear voltage (e.g. a luminance) relationship between such taps. For low voltages, however, the reference input connections to the taps may have a linear spacing in the first direction to provide a linear voltage relationship between such taps. An input voltage is applied to the signal input of all the comparators. Binary signals representative of the input voltage are produced by the comparator in which the input voltage is substantially equal to the reference input voltage introduced to such comparator.

28 Claims, 2 Drawing Sheets

NON-LINEAR ANALOG-TO-DIGITAL CONVERTER

This invention relates to analog-to-digital converters and more particularly relates to non-linear analog-to-digital converters for providing indications of unknown input values in any desired scale such as a luminance scale or a combination of a luminance scale for high values and a linear scale for low values.

Data processing systems operate on digital signals. g However, the inputs to the data processing systems are generally analog. For example, video signals may be continuously measured in a system for digital video recording. These measurements have to be converted to a digital form before they can be introduced to the digital data recording system for storage by such system. Linear analog-to-digital converters have been in use for a considerable number of years to convert such video signals into a digital form. Because the dynamic range, or ratio of largest to smallest detectable signal, is approximately 1000 to 1, a linear analog-to-digital converter for video applications would be required to obtain a resolution of the video signals into approximately 1000 parts.

There are two (2) important parameters in considering the performance of analog-to-digital converters. These are (1) the speed of the conversion and (2) the resolution or accuracy with which the analog data is converted to a digital form. The converters now in use have been successful in accomplishing only one (1) of these two (2) parameters.

In one type of converter, a flash converter, a plurality of comparators are employed to operate on a simultaneous—or parallel—basis. In order to provide an accuracy in the conversion, a large number of comparators have to be used. For example, when a conversion has to be made to ten (10) binary bits, one thousand and twenty four (1024) comparators have to be used. As will be appreciated, this causes the converter to be large, complex, expensive and difficult to produce.

In another type of converter, successive approximations are made to convert the analog value to the corresponding digital value. In each approximation, the value of progressive bits of reduced binary significance is determined. This type of converter is relatively simple and can be quite accurate, particularly if the number of successive approximations is relatively large. However, this type of converter is slow. Furthermore, the time required to obtain a conversion increases as the accuracy of the conversion is increased.

One possible solution to the problem of digitizing video signals is to use a converter which has logarithmic or "log" characteristics. In this type of converter, the resolution is made inversely proportional to the signal level. This results in a constant fractional resolution over the range of conversion. The log conversion characteristic is not the most desirable non-linear conversion characteristic for video signals. At the low end of the dynamic range, the log characteristic has steps which are too fine by comparison to the luminance response of the human eye. Conversely, at the high end of the dynamic range, the steps are too coarse.

Logarithmic converters have traditionally been constructed by using components such as silicon diodes to generate the required input-to-output transfer characteristic. The silicon diode is useful for this purpose because it has a logarithmic current to voltage characteristic. Unfortunately, the conversion characteristic of a silicon diode has some temperature instabilities that cause significant errors, on the order of several millivolts, in the digitization of voltages. Since the signals at the low end of the dynamic range of a video signal are typically just a few millivolts, the errors in the conversion characteristics of the diode produce sizable distortions.

This invention provides an analog-to-digital converter which overcomes the difficulties discussed above. The converter of this invention has any desired non-linear conversion characteristic, such as the luminance characteristic of the human eye. The converter is fast, simple and inexpensive. In one embodiment, the converter includes a pair of resistive film dividers which, when interconnected as taught by this invention, become relatively insensitive to linear gradients in the thickness (or resistivity) of the film in any direction. The film dividers can simply and precisely match the luminance characteristic at low signal levels where the luminance characteristic becomes linear.

In one embodiment of the invention, a first film is disposed on an integrated circuit chip in a first direction to provide progressively increasing resistance values at progressive positions along the film. The film has uniformly spaced taps. First and second reference voltages may be respectively applied to the first and second ends of the film.

A second film may be disposed on the chip in a direction opposite to the first direction at a position displaced in any direction from the first film. The second film may have a construction corresponding to that of the first film. The first and second reference voltages may be respectively applied to the first and second ends of the second film. Particular taps on the first film may be connected to taps in corresponding positions on the second film.

A plurality of differential comparators are provided, each with a signal input and a reference input. Each comparator reference input is connected to an individual one of the taps on the first film, but not necessarily to successive taps. The reference input connections to the taps on the first film may have a non-linear (e.g. luminance) spacing in the first direction to provide a non-linear voltage (e.g. luminance) relationship between such taps. An input voltage is applied to the signal input of all of the comparators. Binary signals representative of the input voltage are produced by the comparator in which the input voltage is substantially equal to the reference input voltage.

Figure 1:
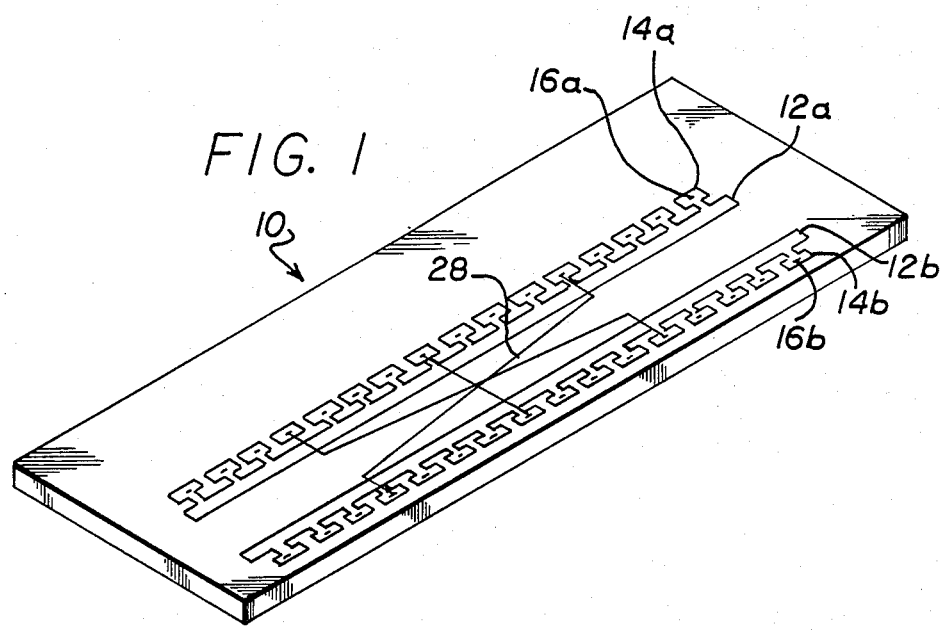
FIG. 1 is a schematic perspective view of an integrated circuit chip incorporating one embodiment of the invention and including first and second reference films disposed on the chip.
Figure 4:
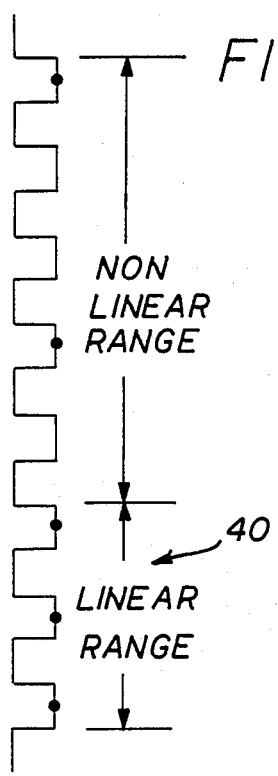
Figure 2:
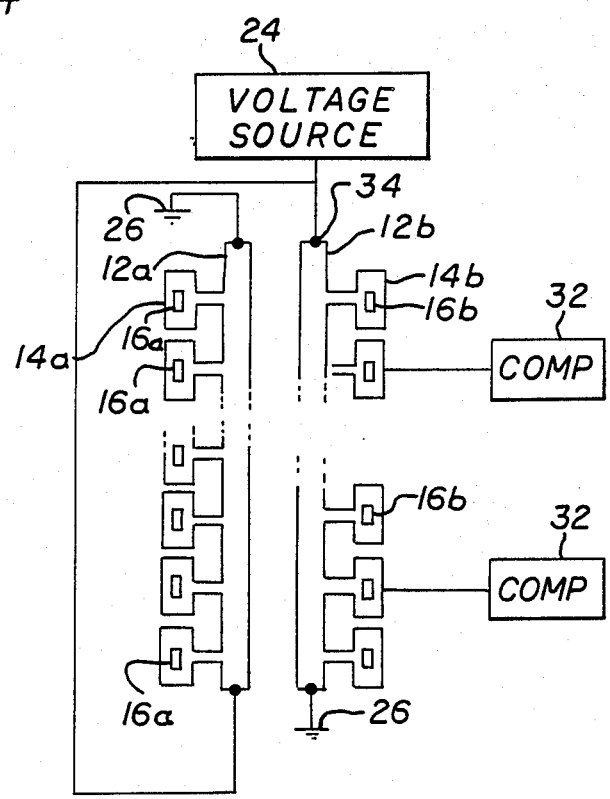
FIG. 2 is a schematic circuit diagram, partly in block form, of one embodiment of the invention for indicating the value of an unknown input value in a non-linear scale.
Figure 3:
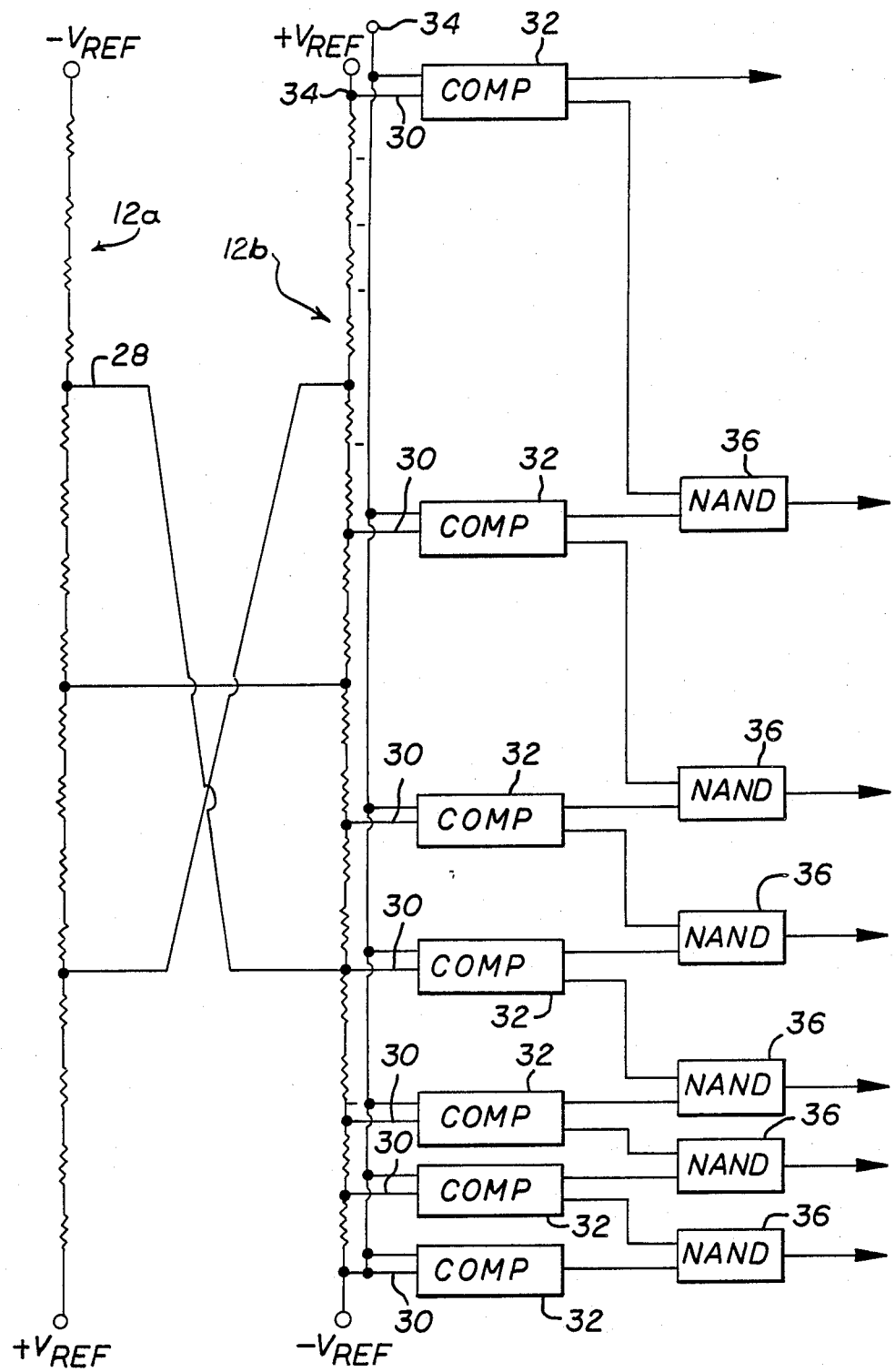

FIG. 3 is an enlarged block diagram illustrating the connection of certain elements of the embodiment of FIG. 2 to the elements on the integrated circuit chip of FIG. 1; and FIG. 4 is a simplified illustration of another embodiment of the invention for providing a plurality of non-linear reference voltages for high reference values and for providing a plurality of linear reference voltages for low reference values.

In the embodiment of the invention shown in FIG. 1, an integrated circuit chip generally indicated at 10 is provided. The chip may have a suitable length such as approximately one fourth of an inch (¼") and a suitable width such as approximately one tenth of an inch (1/10"). Thin film strips 12a and 12b made from a material with electrically resistive properties is formed in a conventional manner on the chip 10. The films 12a and 12b may be illustratively be formed from a material such as polysilicon having a thickness of approximately one half (½) micron.

The film 12a is preferably disposed in a first direction such as a vertical direction in FIGS. 1–3. Preferably the thin film 12a extends, at substantially equally spaced displacements in the first direction, in a second direction coordinate with the first direction. At these positions, the film 12a preferably defines pads 14a. Each of the pads 14a is preferably provided with a rectangular configuration. Each of the pads 14a is completely filled with the resistive material. Taps 16a may be provided within the pads 14a at substantially identical positions within the different pads.

The film 12b may be also formed on the chip 10 with characteristics substantially identical to the film 12. The film 12b may be displaced from the film 12a, preferably in the second direction, such as the horizontal direction. The film 12b may be disposed in an opposite direction to the film 12a so that the first end of the film 12b is opposite to the first end of the film 12a. The film 12b may be provided with pads 14b corresponding to the pads 14a. Taps 16b may be provided within the pads 14b at substantially the same positions as the positions of the taps 16a within the pads 12a.

An energizing potential such as from a voltage source 24 is applied to the first ends of the thin film 12a and the thin film 12b. A reference potential such as a ground 26 (FIG. 2) may be applied to the second ends of the film 12a and the film 12b. In this way, each of the films 12a and 12b operates as a voltage divider in producing, in each of the descending taps 16a and in each of the ascending taps 16b, a voltage of progressively increasing magnitude. Instead of connecting the second ends of the thin films 12a and 12b to a reference potential such as ground, these ends may be connected to a reference potential having a negative value.

Although each of the thin films 12a and 12b is formed by sophisticated manufacturing techniques, differential linearity errors may occur in the resistance value provided by each of the thin films at progressive positions in the films. For example, these errors may occur as a result of progressive changes in the thickness of the films at successive positions along the films or they may occur as a result of progressive changes in the composition of the thin film material at successive positions along the thin films. For example, differential linearity errors as high as one half of one percent (0.5%) may occur in a chip having a length and a width of approximately one half of an inch (0.5"). Although these deviations are not great, they may affect the accuracy of the conversion of an analog value to a digital value, particularly when it is desired that the conversion by quite precise.

As will be seen, the differential linearity errors discussed in the previous paragraph generally occur in a particular direction. Thus, if positive errors occur in an upward direction at progressive positions in the thin film 12a, negative errors of corresponding magnitude will occur at such progressive positions in a downward direction in the thin film 12b. Because the films 12a and 12b extend in opposite directions, the voltage decreases at progressive positions upwardly in the thin film 12a in FIG. 2 but decreases with progressive positions downwardly in the thin film 12b.

Thus, by connecting the thin films 12a and 12b at progressive, but isolated, positions as by leads 28, an average is obtained between the differential voltages between the successive taps 16a and 16b on the films to compensate for any errors resulting from differential non-linearities in either or both of the films. The connections are made to corresponding taps on the thin films 12a and 12b. Each of the leads 28 extends between an individual one of the taps 16a on the thin film 12a and a corresponding one of the taps 16b on the film 12b. Such individual taps 16a on the thin film 12a and such corresponding taps 16b on the film 12b are those which would provide equal voltages if there were no differential non-linearities in the thin films. Only a limited number, such as sixteen (16) of connections has to be provided between the thin films 12a and 12b by the leads 28. Because of this, only a limited number of the taps 16a need be connected on the thin film 12a.

Leads 30 extend from pre-selected ones of the taps 16b in the thin film 12b to first input terminals of comparators 32 which may be constructed in a conventional manner. The taps 16b may be pre-selected to provide the input voltages to successive ones of the comparators 32 with a particular scale. For example, the individual taps 16b connected to the comparators 32 may be pre-selected to provide the input voltages to the comparators 32 with a non-linear scale, such as a logarithmic scale, as shown in the embodiment of FIG. 3. In a logarithmic scale, the distances between successive ones of the taps 16b connected to the comparator 32 increase on a logarithmic basis.

An input voltage is introduced to second input terminals of the comparators 32 as from an electrical terminal 34. Each of the comparators 32 operates in a conventional manner to compare the magnitude of the input voltage on the terminal 34 with the voltage introduced to the comparator from the thin film 12b. Each of the comparators 32 has two output terminals. One of the output terminals from each individual comparator 32 and the other output terminal from the next one of the comparators are connected to input terminals of an associated "nand" network 36. Each of the "nand" networks 36 compares the polarity of the signals on its two input terminals and indicates the results of the comparison on its output terminal.

In two (2) successive comparators 32 in the plurality, the results of the comparison will be opposite. In other words, one such comparator will indicate a greater magnitude of the input voltage than the voltage from the thin film 12b and the other comparator will indicate a lesser magnitude of the input voltage than the voltage from the thin film 12b. The position of these two successive comparators 32 in the plurality provides an indication of the magnitude of the input voltage on the terminal 34. The comparison between the voltages on successive pairs of comparators is provided by the "nand" gates 36 each of which provides an output signal of a particular polarity only when the voltages introduced to the terminals in the "nand" gate have the polarity of a logical "one". The first logical one is provided at the upper or "assertions" output of the lower of the two comparators. The second logical "one" is provided at the lower or "negations" output of the upper of the two comparators.

The converter described above can provide binary indications of the input voltage on the terminal 34 with great accuracy. For example if the thin film 12b is considered to provide a voltage divider with four thousand and ninety six (4096) taps 16b along a linear distance of approximately 0.496 inches, the center-to-center spacing between successive ones of the taps 16b may be approximately one tenth of one mil (0.1 mil) or approximately two and one half microns (2.5μ).

Assume that the integrated circuit chip 10 is formulated by eight tenths of a micron (0.8 μ) technology. Under such circumstances, there would be ample spacing between successive taps 16b to route metal leads 28, if necessary, from successive taps 16b to successive ones of the comparators 32 at the end of the thin film 12b near the ground 26. At the low end of the voltage divider defined by the thin film 12b, successive ones of the taps 16b may have to be connected to successive ones of the comparators 32 to provide a linear conversion.

Connections may then be made with any required spacing between successive ones of the taps 16b to a linear array of the comparators 32 positioned on the chip 10 adjacent to the thin film 12b. For example, if the comparator pitch should be one mil (1 mil) or twenty five microns (25μ), as many as four hundred and ninety six (496) comparators 32 may be disposed on the chip 10 along the length of the thin film 12b. Under such circumstances, the converter described above may provide a conversion with a dynamic range of over four thousand (4,000) to one (1).

As can be seen, a non-linear conversion, such as a logarithmic conversion, between analog and digital values can be provided throughout the full range of the thin film 12b. For example, this may occur when the conversion is provided for the images on an x-ray film. However, under other circumstances, it may be desirable to provide a non-linear conversion, such as a luminance conversion, throughout most of the range of the thin film 12b but to provide a linear conversion at the low end of this range. For example, although the human eye provides a luminance conversion of visual images, a linear conversion at the low end of the intensity range may be desirable for video film images. Such a conversion may be desirable since the human eye is not able to provide a nor-linear conversion of video images at low light intensities. Under such circumstances, the taps 16b connected to the comparators 32 may have a linear displacement relative to one another in this low range. This is indicated at 40 in FIG. 4.

As will be seen from the above discussion, the converter constituting this invention is able to convert an analog value to a digital value in any desired non-linear scale, or combination of non-linear scales or combination of non-linear and linear scales, in a highly accurate and simple manner. The converter of this invention is able to provide this accuracy in conversion by the formulation of an integrated circuit chip in a manner well known in the art. The converter provides this accuracy in conversion by the use of a single thin resistive film or a compensating pair of thin resistive films to provide resultant resistance values which compensate for differential non-linearities in each of the thin films. The formulation of resistance values compensating for the differential non-linearities in each of a pair of thin films on an integrated circuit chip and the cross connections between the resistances at a relatively few positions of corresponding value on the resistances are believed to be invertive in themselves.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for use in an analog-to-digital converter,
   an integrated circuit chip,
   a thin resistive film disposed on the chip to provide a resistance having progressively increasing values at progressive positions on the integrated circuit chip,
   a plurality of taps disposed on the film at progressive positions on the film in a particular non-linear relationship,
   means for introducing a particular voltage to the thin film at one end of the thin film,
   means for introducing a reference voltage to the thin film at the opposite end of the thin film to obtain a production of voltages on individual ones of the taps in a non-linear relationship depending upon the positioning of the taps,
   a plurality of comparators,
   means for introducing an input voltage to the comparators,
   means for introducing the voltages on the individual ones of the taps to individual ones of the comparators to provide a comparison between the input voltage and the voltages on such individual ones of the taps, and
   means for providing an indication in digital form of the output from a particular one of the comparators in which the input voltage is substantially equal to the voltage introduced to such particular comparator from the tap associated with such particular comparator.

2. In a combination as set forth in claim 1,
   the resistance on the film having pads with repetitive characteristics at progressive positions on the thin resistive film and the taps being disposed at substantially the same positions within the pads.

3. In a combination as set forth in claim 2, the taps introducing voltages to the individual comparators being disposed to provide the outputs from the comparators with logarithmic characteristics.

4. In a combination as set forth in claim 3,
   the comparators being connected to the individual ones of the taps by leads extending on the integrated circuit chip from the taps to the comparators.

5. In a combination as set forth in claim 4,
   the taps introducing voltages to the individual comparators being disposed to provide the outputs from the comparators with luminance characteristics for input voltages of high value and to provide the outputs from the comparators with linear characteristics for input voltages of low value.

6. In combination for use in an analog-to-digital converter,
   an integrated circuit chip,
   a first thin resistive film disposed in a first direction on the integrated circuit chip and having first and second ends, a second thin resistive film disposed in an opposite direction on the integrated circuit chip at a position displaced from the first thin resistive film, the second resistive film having first and second ends respectively corresponding to the first and second ends on the first thin resistive film, means for applying a particular voltage to the first ends of the first and second thin resistive films, means for applying a reference voltage to the second ends of the first and second thin resistive films to obtain a production of voltage, a plurality of taps at progressive positions on the first and second thin resistive films, the positions of the taps on the second thin resistive film corresponding to the positions of the taps on the first thin resistive film, means for interconnecting particular taps on the first and second thin resistive films where the distance to each of the particular taps from the first ends of the first and second thin resistive film is substantially equal, a plurality of comparators, means for introducing an input voltage to the comparators, means for introducing the voltages on individual ones of the taps in the first thin resistive film to individual ones of the comparators, and means for producing an output from a pair of successive comparators where the input voltage on one of the comparators is greater than the voltage introduced to such comparator from the tap associated with such comparator and the input voltage on the other comparator is less than the voltage introduced to such comparator on the associated tap, the relative disposition of such successive comparators in the plurality of comparators providing an indication of the value of the input voltage.

7. In a combination as set forth in claim 6,
the particular taps on the first and second thin resistive films being disposed at progressively spaced positions on such films.

8. In a combination as set forth in claim 6,
the first and second thin resistive films having dispositions defining pads and the taps being disposed at particular positions within the pads in the first and second thin resistive films.

9. In a combination as set forth in claim 6, the individual ones of the taps in the first thin resistive film having a particular non-linear spacing relative to one another to provide from the successive comparators voltage which have the particular non-linear relationship.

10. In a combination as set forth in claim 7,
the first and second thin resistive films having dispositions defining pads at progressive positions along the thin resistive films and the taps being dispose at a particular position within the pads, and
the individual ones of the taps in the first thin resistive film having a luminance spacing relative to one another.

11. In a combination as set forth in claim 10,
the first and second thin resistive films being disposed at substantially the same positions in the first and second directions but at displaced positions in a second direction coordinate with the first direction.

12. In a combination as set forth in claim 6,
first ones of the individual taps on the first thin resistive film being spaced from one another in a particular non-linear relationship in a first portion of the first thin resistive film and second ones of the individual taps on the first thin resistive film being spaced from one another in a linear relationship in a second portion of the first thin resistive film.

13. In a combination as recited in claim 12,
the first ones of the individual taps on the first thin resistive film being spaced from one another in a luminance relationships and providing higher voltages than the second ones of the individual taps on the first thin resistive film.

14. In combination for use in an analog-to-digital converter,
an integrated circuit chip,
a thin resistive film disposed on the integrated circuit chip and having portions disposed periodically along the thin film to define pads,
first taps disposed at particular positions within the pads,
means for producing progressive voltages at the successive ones of the first taps,
a plurality of comparators,
means for introducing an input voltage to the comparators,
means for respectively introducing, to first individual ones of the comparators, voltages from individual ones of the first taps having a particular non-linear relationship to one another in their disposition on the integrated circuit chip, and
means for connecting the first comparators in pairs to obtain from such paired comparators an output representative of the input voltage.

15. In a combination as set forth in claim 14,
the thin resistive film being disposed in a pattern extending in a first direction and the pads being displaced in a second direction coordinate with the first direction.

16. In a combination as set forth in claim 15,
the pads having a rectangular configuration and the first taps having a logarithmic relationship to one another in their disposition on the integrated circuit chip.

17. In a combination as set forth in claim 14,
the first taps being disposed at substantially the same positions within the pads.

18. In a combination as set forth in claim 17,
second taps disposed on the thin film in a particular linear relationship in their disposition on the thin film,
means for respectively introducing, to second individual ones of the comparators, voltages from individual ones of the second taps,
the individual ones of the first taps being disposed in a first portion of the thin resistive film chip and the individual ones of the second taps being disposed in a second portion of the thin resistive film different from the first portion of the thin film.

19. In a combination as set forth in claim 18,
the voltages on the individual ones of the first taps being greater than the voltages on the individual ones of the second taps and the individual ones of the first taps having a logarithmic relationship to one another in their disposition on the integrated circuit chip.

20. In combination,
an integrated circuit chip, a first thin resistive film disposed on the integrated circuit chip and having portions disposed periodically along the thin film to define pads, a second thin resistive film disposed on the integrated circuit chip and having portions disposed periodically along the thin film to define pads, the second thin resistive film extending in a direction opposite to the first thin resistive film, each of the first and second thin resistive films having first and second ends, taps disposed at progressive positions on the pads of each of the first and second thin films, means for producing progressive voltages at the successive taps in the first direction on the first and second thin resistive thin films, and means for connecting particular taps on the first thin resistive film to corresponding taps on the second thin resistive film, the corresponding taps on the second resistive thin film having substantially the same voltage as the particular taps on the first thin resistive film.

21. In a combination as set forth in claim 20, the pads having a substantially rectangular configuration.

22. In a combination as set forth in claim 21, the taps on the first and second thin resistive films being disposed at particular positions within the pads on such films.

23. In a combination as set forth in claim 21, the connections between the first and second thin films occurring only at selected isolated positions on such films and the pads being displaced from the associated ones of the thin resistive films in a second direction coordinate with the first direction.

24. In a combination as set forth in claim 20, a plurality of comparators, means for introducing an input voltage to the comparators, means for introducing the voltages from individual ones of the taps on the first thin resistive film to individual ones of the comparators, and means for pairing the comparators to obtain from one of such pairs an output representative of the input voltage.

25. In a combination as set forth in claim 20, particular ones of the taps connected to the comparators having a particular non-linear displacement relative to one another in the first direction on the first thin resistive film.

26. In a combination as set forth in claim 25, the particular taps having a luminance displacement relative to one another in the first direction on the first thin resistive film, other ones of the individual taps connected to the comparators being provided with a linear displacement relative to one another in the first direction on the first thin resistive film.

27. In a combination as set forth in claim 25, the particular taps having a luminance displacement relative to one another in the first direction on the first thin resistive film.

28. In a combination as set forth in claim 26, the particular taps being disposed in a first portion of the first thin resistive film and receiving relatively high voltages and the other ones of the individual taps being disposed in a second portion of the thin resistive film and receiving relatively low voltages.

* * * * *